United States Patent [19]

Warner, Jr.

[11] 3,882,529

[45] *May 6, 1975

[54] PUNCH-THROUGH SEMICONDUCTOR DIODES

[75] Inventor: Raymond M. Warner, Jr., Palm Beach, Fla.

[73] Assignee: Texas Instruments Incorporated, Dallas, Tex.

[*] Notice: The portion of the term of this patent subsequent to May 6, 1990, has been disclaimed.

[22] Filed: June 21, 1973

[21] Appl. No.: 372,462

Related U.S. Application Data

[63] Continuation of Ser. No. 673,467, Oct. 6, 1967, abandoned.

[52] U.S. Cl. .................... 357/13; 307/202; 357/40; 357/41; 357/42

[51] Int. Cl. ........................ H011 11/00; H011 15/00

[58] Field of Search ...... 317/235 G, 235 T; 307/202

[56] References Cited

UNITED STATES PATENTS

| | | | |
|---|---|---|---|
| 3,391,287 | 7/1968 | Kao et al. | 317/235 |
| 3,469,155 | 9/1969 | Van Beek | 317/235 |
| 3,764,864 | 10/1973 | Okumura et al. | 317/235 |

*Primary Examiner*—Andrew J. James
*Attorney, Agent, or Firm*—Harold Levine; James T. Comfort; Gary C. Honeycutt

[57] ABSTRACT

A punch-through semiconductor device having three regions of alternate conductivity types which exhibit punch-through conduction characteristics similar to the breakdown characteristics of a Zener diode when a voltage equal to the punch-through voltage magnitude is applied across the device. The device is formed on a single semiconductor crystal for use in a number of different circuits requiring output characteristics similar to those of a Zener diode.

2 Claims, 14 Drawing Figures

PUNCH-THROUGH SEMICONDUCTOR DIODES

This is a continuation, of application Ser. No. 673,467, filed Oct. 6, 1967 and now abandoned.

This invention relates to semiconductor diodes and more particularly to semiconductor diodes exhibiting punch-through conduction characteristics.

A plurality of different circuit applications have heretofore been developed which utilize the sharp voltage breakdown exhibited by various types of diodes. More particularly, silicon diodes have been widely used for voltage regulation and reference purposes as a result of the diodes' breakdown reverse-voltage, commonly called the Zener voltage. The series connection of a Zener diode with a resistance is a commonly used building block in electronic circuitry due to the face that the output voltage across the Zener diode remains very nearly constant during relatively wide variations in the bias voltage applied to the resistor, as long as the applied bias voltage is greater than the Zener breakdown voltage. However, the conventional silicon Zener diodes are often found to have fabrication requirements that are not consistent with those of miniaturized electronic circuitry.

Three layer semiconductor devices, either PNP or NPN, which utilize to advantage the phenomenon known as punch-through have heretofore been proposed as active elements in high frequency oscillators and the like. However, it is believed that punch-through semiconductor devices have not generally been heretofore utilized to perform voltage regulation and voltage reference functions based upon the sharp conduction characteristics of the devices at punch-through. Moreover, the fabrication of three layer punch-through devices has generally heretofore required the relatively complex formation of an epitaxial layer and the subsequent diffusion of a region of opposite conductivity, or else has required double diffusion. The construction of punch-through diode devices has thus not been heretofore compatible with conventional fabrication techniques for such devices as metal-oxide-semiconductor (MOS) devices.

In accordance with the present invention, a semiconductor device is provided which comprises a plurality of regions of alternate conductivity types which exhibit sharply rising conduction characteristics upon the application of a predetermined voltage, due to punch-through conduction between the regions. The current-voltage characteristics provided by the semiconductor device may be utilized in a number of different methods and circuit applications to regulate and otherwise limit voltage amplitude.

For a more complete understanding of the present invention and for further objects and advantages thereof, reference may now be had to the following description taken in conjunction with the accompanying drawings in which.

Figure 1:
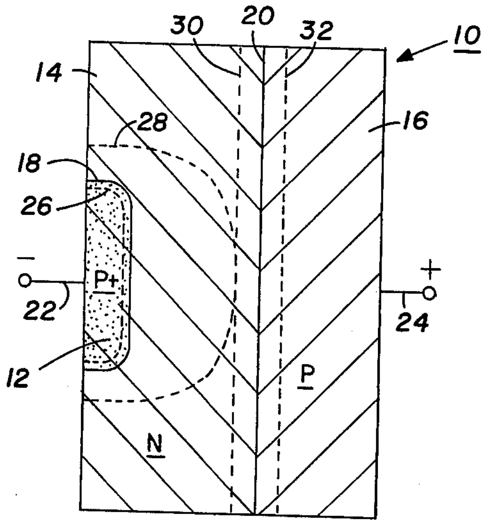
FIG. 1 is a somewhat diagrammatic section of one embodiment of a punch-through diode device.

Referring to FIG. 1, a schematic diagram of a punch-through diode 10 according to the invention is illustrated. While for simplicity of explanation the operation of PNP devices will be explained throughout the specification, the diodes could be NPN devices, which would function in a similar manner except that an opposite bias is required and the carriers would be electrons rather than holes.

The diode 10 comprises a diffused P-type region 12, an N-type region 14 and a lightly doped P-type region 16. The three semiconductive layers of alternate conductivity type form a pair of spaced apart junctions 18 and 20. Upon the application of a negative voltage to an electrode 22 and a positive voltage to an electrode 24, the junction 18 will become reverse biased and the junction 20 is forward biased. A relatively thick depletion layer represented schematically by the dotted lines 26 and 28 is formed at the junction 18 as a result of the reverse bias. As a result of the forward bias at the junction 20, a relatively thin depletion layer represented by the dotted lines 30 and 32 is formed.

It will be understood that the boundaries of the depletion layers of the device are not distinct or regular, and thus the dotted lines are merely representative of the boundaries for illustrative purposes.

It is of particular importance for the proper operation of the diode 10 that the geometry and doping levels of the regions be such that the depletion layer edge 28 of the reverse biased junction 18 extends to and touches the depletion layer edge 30 of the forward biased junction 20 at a bias voltage level substantially less than the voltage required to produce avalanching. A typical such voltage level is about one-tenth the avalanche voltage. In general, the higher the doping level of region 12 and the lower the doping level of region 14, the larger the depletion layer occurring at junction 18 for a given bias voltage. The thickness of the N-type region 14 is an important factor in the construction of the diode 10, as is the fact that the P-type region 16 should be a very lightly doped region in order to be a relatively poor emitter of carriers.

The device 10 may be fabricated by any one of a number of conventional techniques. For example, the N-type layer 14 may be epitaxially formed on the P-type layer 16. The P-type region 12 is then diffused into the layer 14. The electrodes 22 and 24 should have good ohmic contact with the regions 12 and 16.

Figure 2:
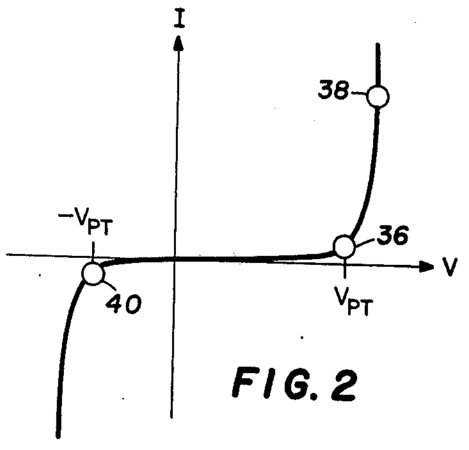
FIG. 2 is a graph illustrating the output characteristics of the device shown in FIG. 1.

The operation of the device 10 may be understood by reference to FIGS. 1 and 2. A voltage is impressed across the electrodes 22 and 24 of a magnitude sufficient to cause the depletion layer 28 of the reverse biased junction 18 to reach through the intervening layer of the N-type region 14 to contact and begin to interact with the depletion layer of the forward biased junction 20, as illustrated in FIG. 1. The bias voltage necessary for this condition of the device 10 is termed the punch-through voltage. At this voltage, a voltage barrier exists in the forward-biased junction 20 of a magnitude sufficient to prevent all but a small amount of current flow through the device, as illustrated by the point 36 on the graph of FIG. 2.

With only a slight further increase in the applied voltage beyond the punch-through voltage, the current through the device 10 increases rather sharply because the potential barrier restraining the hole carriers from leaving the region 16 is reduced in magnitude. The hole carriers are "dumped" into the depletion layer of the reverse-biased junction 18 and swept to the P-type region 12. This causes a punch-through conduction characteristic, illustrated generally by the curve position 38 on the graph of FIG. 2, which is very similar to the breakdown voltage of the Zener diode. If the voltage applied across the electrodes 22 and 24 is reversed in polarity, a similar sharp conduction occurs at a negative punch-through voltage, as illustrated by the point 40 on the graph of FIG. 2.

An actual operation of a device constructed in accordance with the device 10 of FIG. 1 produced a positive punch-through voltage of 20 volts, along with a negative punch-through voltage of about −10 volts. This asymetrical punch-through voltage characteristic occurs because of the shape of the diffused region 12 and because the P-type region 12 is more heavily doped than the P-type region 16, causing the depletion layer of the left junction to be more one-sided than the depletion layer of the right junction. The diffused region 12 thus utilizes reverse voltage more efficiently in reaching through the N-type channel than does the region 16. It will thus be seen that by varying the configuration and the impurity profile of the device 10, any desired level of punch-through voltage may be designed into the device within wide limits.

Figure 3:
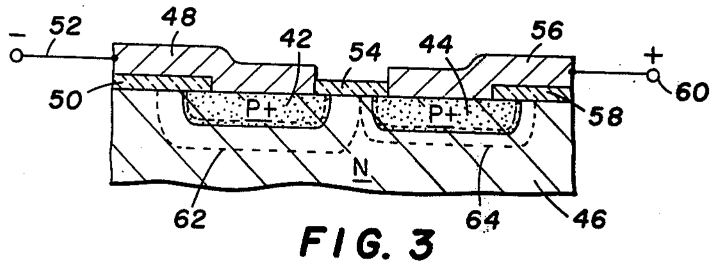
FIG. 3 is a somewhat diagrammatic sectional view of another embodiment of the punch-through device according to the invention.

FIG. 3 illustrates an embodiment of the present punch-through diode constructed utilizing fabrication techniques commonly used to construct enhancement-mode MOS circuitry. A pair of relatively heavily doped P-type regions 42 and 44 are diffused into an N-type crystal 46. A metal layer 48 electrically contacts the P-type region 42 and is insulated from the N-type region 46 by an insulating layer 50. An electrode 52 is connected to the metal layer 48. An insulating layer 54 insulates the N-type region separating the diffused regions 42 and 44. A second metal layer 56 is in electrical contact with the P-type diffused region 44 and is insulated from the N-type region 46 by an insulating layer 58. An electrode 60 is in electrical contact with the metal layer 56.

In the operation of the device shown in FIG. 3, a negative voltage is applied to electrode 52 and a positive voltage applied to electrode 60 in order to reverse bias the junction between the diffused layer 42 and the N-type layer 46. A depletion layer having its outside boundary defined by the dotted line 62 is formed about the reverse-biased junction. Conversely, the junction between the diffused region 44 and the N-type region 46 is forward biased, thus forming a somewhat smaller depletion layer, the outside boundary being defined by the dotted line 64. When a bias voltage is applied equal to the punch-through voltage of the device, the depletion layer boundary 62 will touch the depletion layer boundary line 64, thereby causing lateral punch-through, as illustrated in FIG. 3. Upon a slight increase in voltage, the device will heavily conduct, thereby providing a punch-through conduction characteristic similar to the curve shown in FIG. 2.

Figure 4:
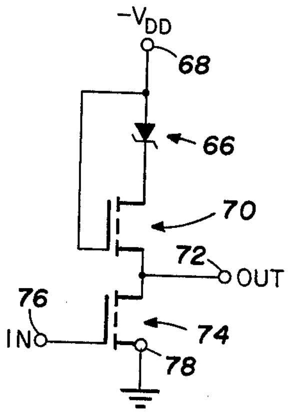
FIG. 4 is a schematic diagram of a circuit utilizing the conduction characteristics of a punch-through device.

FIG. 4 illustrates a schematic diagram of a circuit in which the punch-through diode of the invention may be advantageously utilized. In many field effect transistor (FET) circuits, the control gate of the FET device is directly connected to the drain of the device in order to form an active load. Problems have heretofore been encountered in the use of this active load due to the resulting nonlinear I–V characteristics of the load, which cause the FET circuitry to have relatively slow response times.

It has been found that by providing a higher gate bias to the active load device than the bias provided to the drain of the device, that the device provides a more linear load, thereby improving the response time of the circuitry. This has heretofore often been accomplished by the provision of two separate voltage supplies, adding expense and complexity to circuits. The circuit shown in FIG. 4, utilizes the present punch-through diode device to linearize an active FET load without the provision of two separate bias voltage supplies.

A diagrammatic illustration of a punch-through diode is designated generally by the numeral 66. The anode of the diode device 66 is connected to a terminal 68 to which a negative bias voltage $V_{DD}$ is supplied. The negative bias voltage $V_{DD}$ is supplied directly to the control gate of a FET device 70, which has a drain connected to the cathode of the diode 66. The source of the FET device 70 is connected to an output terminal 72 and to the drain of a driver FET device 74. The control gate of the device 74 is connected to a terminal 76 which receives input signals, while the source of the device 74 is connected to a terminal 78 which is returned to ground. The diode 66 is chosen to have a predetermined punch-through voltage in order that the drain of the transistor 70 will be placed at a lower negative voltage than the control gate of the transistor 70. For instance, if the diode 66 is found to have a negative 10 volt punch-through or Zener voltage, and a negative 25 volts is applied to terminal 68, the drain of the transistor 70 is maintained at a negative 15 volts, thereby providing a more linear load for the driver transistor 74.

Figure 5:
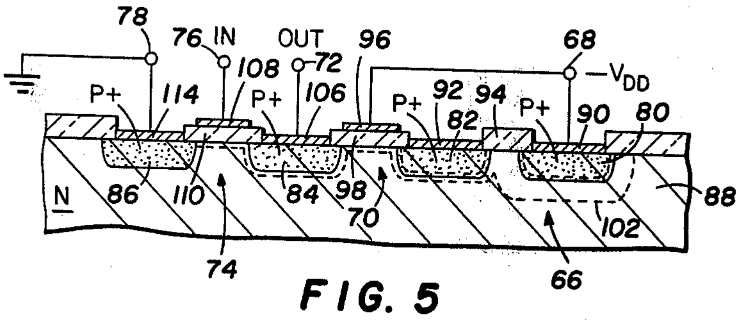
FIG. 5 is a somewhat diagrammatic sectional view of the circuit shown in FIG. 4.

A very advantageous fabrication of the circuit shown schematically in FIG. 4 may be accomplished by multiple diffusion on one surface of a semiconductor crystal, as illustrated in FIG. 5. Like numerals are applied to like and corresponding parts in FIGS. 4 and 5. Four P-type diffused regions 80, 82, 84 and 86 are formed on one surface of an N-type layer 88. A pair of metal layers 90 and 92 contact the diffused regions 80 and 82, respectively, and are separated by an insulating layer 94. Metal layer 90 is directly connected to terminal 68 to which is supplied a negative biasing voltage. Terminal 68 is also directly connected to a metal layer 96 which is insulated from the semiconductor regions by an insulating layer 98.

Metal layer 96 bridges the diffused regions 82 and 84 to form an enhancement-mode channel upon proper biasing of the device. The application of the negative bias voltage also causes a depletion layer designated generally by the dotted line 102 to be formed about the reverse biased junction between the diffused layer 80 and the N-type layer 88. At punch-through voltage, this depletion layer 102 extends essentially into contact with the junction between the diffused layer 82 and the N-type layer 88.

A metal layer 106 is in contact with the diffused region 84 to form the commonly connected source of the transistor 70 and the drain of the transistor 74. The metal layer 106 is connected to the output terminal 72. A metal layer 108 is electrically insulated from the semiconductor regions by an insulating layer 110 and is connected to the terminal 76 to receive an input signal. The metal layer 108 bridges the diffused regions 84 and 86 to form an enhancement-mode channel upon proper biasing. The metal layer 114 electrically contacts the diffused region 86 to form the source of the transistor 74 and is connected to the terminal 78 for return to ground. It will thus be seen that a punch-through diode according to the invention may be economically and efficiently formed on a single semiconductor crystal along with a number of MOS FET devices.

Figure 6:
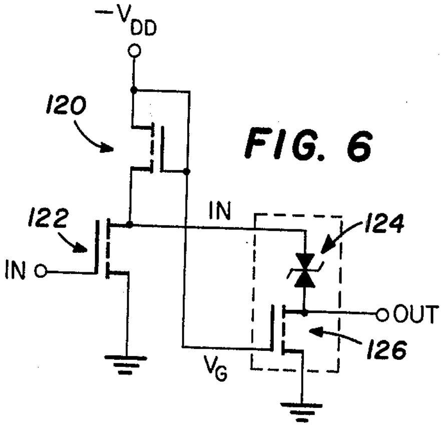
FIG. 6 is a schematic diagram of another circuit utilizing conduction characteristics of a punch-through device according to the invention.

FIG. 6 illustrates another circuit wherein the punch-through voltage characteristics of the present punch-through diode may be advantageously utilized. The circuit shown in FIG. 6 down shifts the output voltage from an inverter stage comprising a load field effect transistor 120 and a driver transistor 122. A punch-through diode designated generally by the numeral 124 is connected in series between the output of transistor 122 and the output of a field effect transistor 126. The output from the drain of the transistor 122 is decreased in amplitude due to the breakdown voltage drop of the diode 124.

Figure 7:
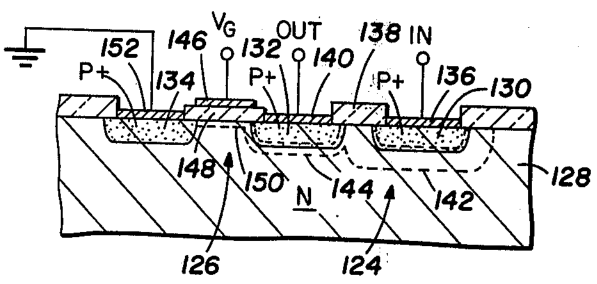
FIG. 7 is a somewhat diagrammatic sectional view of a portion of the circuit shown in FIG. 6.

FIG. 7 illustrates a construction of the diode 124 and the transistor 122 on a single N-type substrate 128 by the utilization of metal-oxide-semiconductor fabrication techniques. The circuit shown in FIG. 7 is constructed somewhat similarly to the circuit of FIG. 5, and is formed by diffusing the P-type regions 130, 132 and 134 into the N-type substrate 128. A metal layer 136 connects the diffused region 130 with the bias voltage terminal. An insulating layer 138 separates layer 136 from a metal layer 140 which connects the diffused region 132 to the signal output terminal.

Upon the application of a sufficient negative biasing voltage, the depletion layer designated generally by the dotted line 142 is formed about the reverse-biased junction between the diffused layer 130 and the N-type substrate 128. At the punch-through voltage, this depletion layer reaches and interacts with the depletion layer designated generally by the dotted line 144 formed about the junction between the diffused region 132 and the N-type substrate 128. The punch-through voltage characteristics illustrated in FIG. 2 thus occur between the diffused regions 130 and 132.

A metal layer 146 is connected to an input signal terminal and is insulated by an insulating layer 148 to bridge the diffused regions 132 and 134 and form an enhancement-mode channel designated generally by the dotted line 150. A metal layer 152 is in electrical contact with the diffused region 134 to serve as a source terminal for connection to ground.

Figure 8:
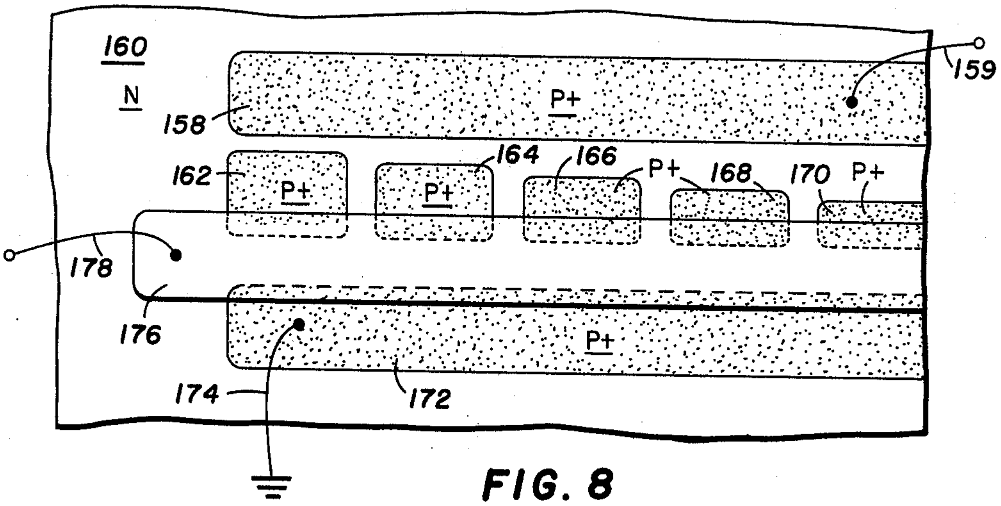
FIG. 8 is a somewhat diagrammatic plan view of another embodiment of the punch-through device of the invention.

FIG. 8 is another embodiment of a circuit wherein sharply rising voltage characteristics due to punch-through between semiconductor regions of like conductivity are utilized. A diffused P-type region 158 having an elongated plan configuration is diffused into the N-type substrate 160 and is connected to an electrode 159. A plurality of generally rectangular P-type regions 162–170 are formed along the length of the elongated diffused region 158 and are spaced from the region 158 at graduated intervals. For instance, the diffused region 162 is disposed relatively near the region 158, while the region 170 is spaced relatively far from the region 158. A second P-type region 172 having an elongated configuration is diffused in the N-type substrate 160 and is connected to ground by a suitable electrode 174.

A metal layer 176 is electrically connected to an electrode 178 and serves as a common control gate between each of the diffused regions 162–170 and the diffused region 172. Enchancement-mode channels are formed at proper bias voltage between diffused regions 162–170 and region 172. The cross section of the device shown in FIG. 8 resembles the circuit cross section shown in FIG. 7.

In operation, it will be apparent that when a negative voltage of sufficient amplitude is applied across the terminals 159 and 174, the depletion layer between the junction of the diffused region 158 and the N-type substrate 160 will extend outwardly and will contact the depletion region formed about the junction between the region 162 and the N-type substrate 160. Punch-through will first occur between the diffused region 158 and 162. Upon a further increase in bias voltage, the depletion layer of the diffused region 158 will further extend outwardly and come into contact with the depletion layer formed about the diffused region 164. Punch-through will then occur between the diffused region 158 and the diffused region 164. Similar punch-through will sequentially occur upon further increase in bias voltage between the diffused region 158 and the remainder of the diffused regions 166, 168 and 170.

Figure 9:
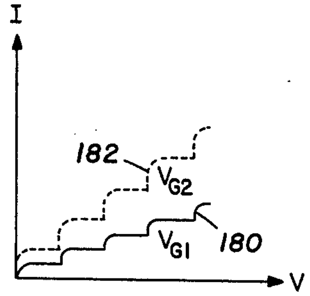
FIGS. 9–11 are graphs illustrating the operation of the circuit shown in FIG. 8 with various applied voltages.

The circuit shown in FIG. 8 thus provides a very useful circuit for providing a staircase characteristic output upon the application of a varying bias voltage to the circuit. A fixed negative bias voltage is applied to the gate electrode 178 having a magnitude depending on the desired amplitude for an individual current step produced by the device. Thus, when a negative voltage $V_{G1}$ is applied to the electrode 178 and an increasing bias voltage is applied across the terminals 159 and 174, the stairstep I–V curve 180 in FIG. 9 will occur. Upon the application of a different negative voltage $V_{G2}$ to the electrode 178, the high amplitude stairstep I–V output characteristic illustrated by the curve 182 in FIG. 9 will be provided.

Figure 10:
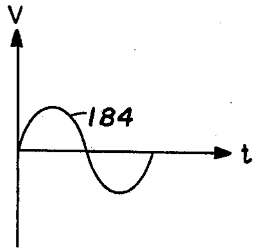
Figure 11:
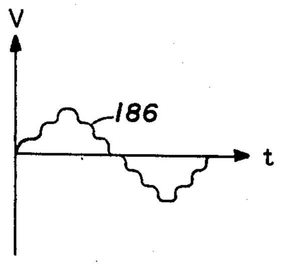

With the utilization of the circuit shown in FIG. 8 as a load, a smoothly varying signal may be quantitized into a plurality of discrete voltage levels. For instance, if a sinusoidal voltage shown in FIG. 10 is applied to the device, the resulting output will be seen as the quantitized waveform illustrated by the curve 186 in the FIG. 11. The circuit of FIG. 8 could then be used in the analog-to-digital conversion of a low frequency signal.

Figures 12, 13:
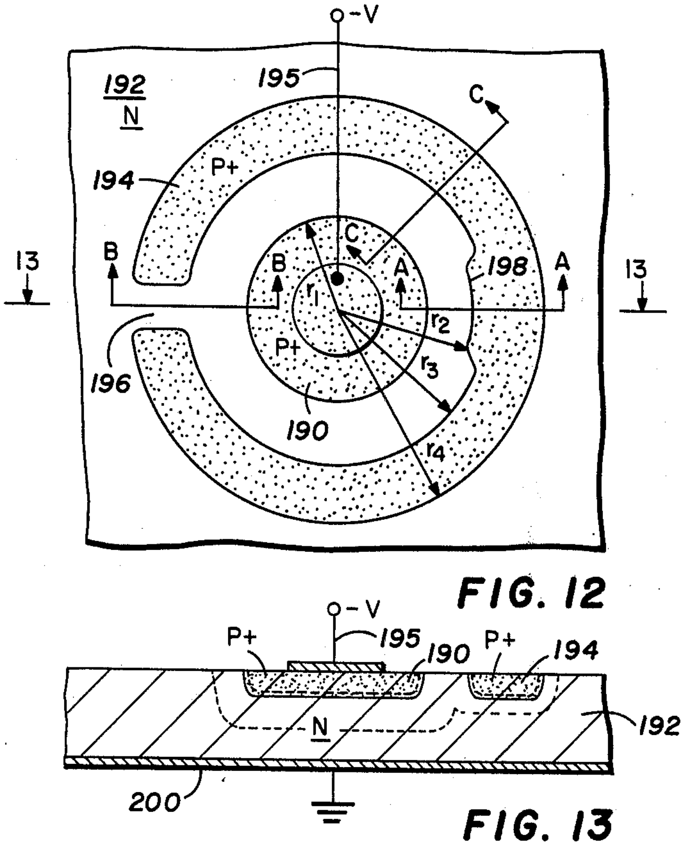
FIG. 12 is a somewhat diagrammatic plan view of another embodiment of a punch-through device according to the invention.
FIG. 13 is a diagrammatic sectional view of the circuit shown in FIG. 12 taken generally along the section lines 13—13.

Another embodiment of a device utilizing the punch-through diode characteristics of the invention is illustrated in FIGS. 12 and 13. The circuit shown in FIGS.

12 and 13 is useful in eliminating ion migration near the reverse-biased junctions in a high voltage semiconductor device. A more complex embodiment of the structure shown in FIG. 12 would find usefulness in serving as a gaurd ring type structure wherein a relatively high voltage applied to the center of the device would be gradually broken down into lesser voltages as punch-through occurred across successive concentric lateral layers of the device.

A substantially circular diffused region 190 is formed on an N-type substrate 192, with a concentric outer annular ring 194 being diffused about the region 190. An electrode 195 is attached to region 190 for the application of a negative voltage. A gap 196 is provided in the annular ring 194 in addition to a portion of enlarged width 198. A metal layer 200 on the bottom of the N-type substrate 192 is connected to an electrode which is returned to ground. The combination of an enlarged width portion and a gap in the annular ring 194 provides a gradual punch-through between the diffused region 190 and the region 194, which causes a vastly lengthened leakage path for the ions, thereby tending to prevent the wide migration of the ions from the center diffused region 190.

Figure 14:
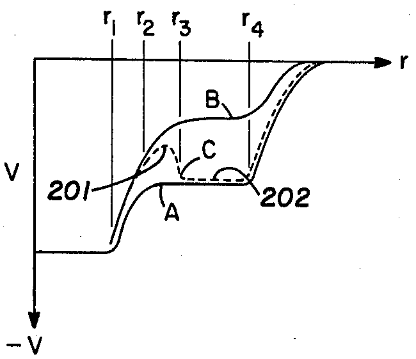
FIG. 14 is a graph illustrating the voltage distribution characteristics of the device shown in FIG. 12.

FIG. 14 is a graphical representation of the voltage distribution of the device across three sections A—A, B—B and C—C with respect to various radii of the device. Upon the application of a negative bias voltage across the terminals of the device sufficient to create depletion layers to exist about the diffused region 190, two levels of voltage will exist over most of the device, as illustrated by curve A in FIG. 14. However, a much lower voltage exists between $r_1$ and $r_4$ along the section line B—B taken through the gap 196. A minimum voltage 201 and a maximum voltage 202 exists across the device along the section line C—C. Punch-through thus first occurs between the diffused region 190 and the ring 194 at the enlarged width region 198. The outer ring 194 will then have applied to it a voltage dependent upon the spacing between the increased width area 198 and the surface of the center diffused region 190, in addition to the impurity distributions of the relative diffused regions.

The gap 196 in the outer annular ring 194 serves to increase the voltage in the N-type substrate 192 between the diffused region 190 and the diffused region 194 to a level which is determined by the merging of the depletion layers of the two regions. This voltage may be varied by varying the width of the gap 196. In proper operation of the device shown in FIG. 12, the leakage path for ions is substantially lengthened, as a positive ion crossing the N-type substrate 192 between the diffused regions 190 and 194 would have to move circumferentially around to the gap 196 in order to escape, at any spot except at the enlarged portion 198.

It will be understood that other gapped annular rings similar to the ring 194 could be concentrically added to the present invention for improved performance. It is advantageous to dispose the gaps in the added rings to an angle with respect to the gap 196.

From the foregoing detailed description of several embodiments of the invention, it will be appreciated that a punch-through diode device having a number of advantageous applications has been described which may be designed and fabricated with relative economy and space minimization. Although preferred embodiments of the invention have been described in detail, it is to be understood that various changes and modifications may be made by one skilled in the art without departing from the spirit or scope of the invention as defined by the appended claims.

What is claimed is:

1. In an integrated semiconductor circuit, a punch-through device for voltage regulation comprising:

a semiconductor body of a first conductivity type having a planar surface, an elongated relatively highly doped first region of a second conductivity type disposed in said semiconductor body and extending to the planar surface of said semiconductor body, a plurality of relatively highly doped second regions of said second conductivity type disposed in said semiconductor body and extending to the planar surface thereof, said plurality of second regions being spaced from said elongated first region and disposed along the length thereof, terminal means ohmically connected to at least said elongated first region, said plurality of second regions being disposed in relatively closely spaced relationship with respect to said elongated first region with progressively increasing distance between each successive region and said elongated first region, to define a plurality of semiconductor junctions with said semiconductor body having depletion regions which respectively interact upon the application of progressively increasing voltages to said terminal means wherein each of said voltages is less than the avalanche voltage of the device, an elongated relatively highly doped third region of said second conductivity type disposed in said semiconductor body and extending to the planar surface thereof, said third region being located on the side of said plurality of second regions opposite from that of said elongated first region and being in spaced relationship with respect to said plurality of second regions, an insulating layer overlying the space between said elongated third region and said plurality of second regions, an elongated gate electrode on said insulating layer, a terminal ohmically connected to said gate electrode, and said device comprising a punch-through diode and said plurality of second regions cooperating with said elongated third region to define enhancement mode channels providing an enhancement mode metal oxide semiconductor device in series with said punch-through diode.

2. In an integrated semiconductor circuit, a punch-through device for voltage regulation comprising:

a semiconductor body of a first conductivity type having a planar surface, a pair of relatively highly doped regions of a second conductivity type disposed in said semiconductor body in relatively closely spaced relationship with respect to each other and extending to the planar surface of said semiconductor body to define a pair of semiconductor junctions with said semiconductor body, terminal means ohmically connected to at least one of said pair of relatively highly doped regions of said second conductivity type, the space between said pair of relatively highly doped regions of said second conductivity type being predetermined in accordance with the relative doping of said regions to provide depletion regions associated with said semiconductor junctions which will interact upon the application of a voltage to said terminal means less than the avalanche voltage of the device, said pair of relatively highly doped regions including an inner region of substantially circular configuration to which said terminal means is ohmically connected and an outer region of substantially annular configuration disposed in concentric relationship with respect to each other, said outer region having a gap in a portion of its substantially annular configuration, said substantially annular configuration having a segment of enlarged width relative to its remaining portion, and the space between said inner and outer relatively highly doped regions being decreased in the area of the portion of said outer region of enlarged width as compared to the space between said inner region and the remaining portion of said outer region.

* * * * *